United States Patent
Kozuka et al.

(10) Patent No.: US 6,437,309 B1
(45) Date of Patent: Aug. 20, 2002

(54) PHOTOELECTRIC TRANSDUCER

(75) Inventors: Hiraku Kozuka, Hiratsuka; Shigetoshi Sugawa, Atsugi, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/694,275

(22) Filed: Oct. 24, 2000

Related U.S. Application Data

(62) Division of application No. 09/084,997, filed on May 28, 1998, now Pat. No. 6,163,024.

(30) Foreign Application Priority Data

May 30, 1997 (JP) ............................................. 9-142191

(51) Int. Cl.⁷ ................................................. H01L 31/02
(52) U.S. Cl. ............................... 250/214 R; 250/214.1; 250/214 A; 250/208.1
(58) Field of Search ........................ 250/214 A, 214 R, 250/214.1, 208.1, 208.2; 257/431, 443, 444, 446, 290, 291

(56) References Cited

U.S. PATENT DOCUMENTS

| | | | |
|---|---|---|---|
| 5,401,952 A | 3/1995 | Sugawa | 250/208 |
| 5,453,629 A | 9/1995 | Gofuku et al. | 257/186 |
| 5,481,124 A | 1/1996 | Kozuka et al. | 257/185 |
| 5,677,201 A | 10/1997 | Kozuka et al. | 437/3 |
| 5,861,655 A | 1/1999 | Kozuka et al. | 257/446 |
| 5,917,960 A | 6/1999 | Sugawa | 382/278 |
| 6,163,024 A | * 12/2000 | Kozuka et al. | 250/214 A |

FOREIGN PATENT DOCUMENTS

| | | |
|---|---|---|
| JP | 4-223771 | 8/1992 |
| JP | 7-44254 | 2/1995 |
| JP | 9-65215 | 3/1997 |

* cited by examiner

*Primary Examiner*—Stephone Allen
(74) *Attorney, Agent, or Firm*—Fitzpatrick, Cella, Harper & Scinto

(57) ABSTRACT

A photoelectric transducer having a CMOS constant-current-source circuit which can reduce fixed-pattern noise even if the CMOS constant-current-source circuit and photosensors are formed in the same semiconductor substrate is provided. The photoelectric transducer includes a constant-current-source circuit in which a current mirror circuit including pMOS transistors and a current mirror circuit including nMOS transistors are subjected to tandem connection between power supplies, and a plurality of photosensors formed by a second-conduction-type semiconductor formed near a surface of a first-conduction-type semiconductor substrate. The constant-current-source circuit and the plurality of photosensors are formed on the same semiconductor substrate. A voltage drop circuit is provided at one of tandem connection portions of the current mirror circuits in order to suppress stray carriers present near the plurality of photosensors.

11 Claims, 5 Drawing Sheets

PHOTOELECTRIC TRANSDUCER

This is a division of application Ser. No. 09/084,997, filed May 28, 1998, now U.S. Pat. No. 6,163,024.

BACKGROUND OF THE INVENTION

1. Field of the Invention

The present invention relates to a one-dimensional or two-dimensional photoelectric transducer in which a semiconductor circuit including a plurality of photosensors using, for example, pn junctions is formed in the same semiconductor substrate. More particularly, the invention relates to a photoelectric transducer having a circuit configuration effective for reducing noise, such as fixed-pattern noise or the like.

2. Description of the Related Art

Recently, photoelectric transducers in which photosensors and a peripheral circuit are formed on the same substrate have been actively developed.

For example, a linear sensor in which an operational amplifier and photosensors are formed on the same semiconductor substrate (The Journal of the Institute of Television Engineers of Japan, Vo. 47, No. 9 (1993), pp. 1180), an image sensor having a sample-and-hold circuit (Japanese Patent Laid-Open Application (Kokai) No. 4-223771 (1992), and a solid-state image pickup device having an internal reference-voltage generation circuit configured by an operational amplifier (Japanese Patent Laid-Open Application (Kokai) No. 9-65215 (1997) have been proposed.

In general, a bias current for an operational amplifier is generated using a constant-current-source circuit. When forming such a constant-current-source circuit using MOS (metal oxide semiconductor) transistors, for example, a CMOS (complementary MOS) constant-current-source circuit as shown in FIG. 1 (R. Gregorian, G.C. Temes: Analog MOS Integrated Circuits for Signal Processing, p. 127, FIG. 4.5. ) is generally used. A CMOS constant-current-source circuit as disclosed in Japanese Patent Laid-Open Application (Kokai) No. 7-44254 (1995) has also been proposed.

The CMOS constant-current-source circuit shown in FIG. 1 is obtained by performing tandem connection of an upper-stage current mirror circuit and a lower-stage current mirror circuit between a power supply $V_{DD}$ and the ground. A constant-voltage-source output $V_{O1}$ is obtained from a connection point of the upper-stage current mirror circuit and the lower-stage current mirror circuit. That is, the upper-stage current mirror circuit includes a pMOS transistor Q4, whose source is connected to the power supply $V_{DD}$, and a pMOS transistor Q3. The gates of the pMOS transistor Q4 and the pMOS transistor Q3 are connected to each other, and the gate and the drain of the pMOS transistor Q3 are directly connected, so that each drain supplies the load side with the same current $I_{bias}$. The lower-stage current mirror circuit includes an nMOS transistor Q1, whose source is connected to the ground, and an nMOS transistor Q2 whose source is connected to the ground via a resistor R. The gates of the nMOS transistor Q1 and the nMOS transistor Q2 are connected to each other, and the gate and the drain of the nMOS transistor Q1 are directly connected, so that each drain obtains the same current from the load side. A constant current by the current mirror circuit passes through the resistor R. An output voltage provided by a voltage generated in the resistor R and the source-drain voltage of the nMOS transistor Q2 is output as the constant voltage $V_{O1}$ of this voltage source.

However, the inventors of the present invention have found that in conventional photoelectric transducers in which a CMOS constant-current-source circuit and photosensors are formed in the same semiconductor substrate, the CMOS constant-current-source circuit generates fixed-pattern noise.

When a voltage is applied to the gate of a MOS transistor, and a voltage is applied between the source and the drain in a state in which a channel is formed, carriers are accelerated by the concentration of the electric field near the end of the drain in the channel, to generate avalanche multiplication. Most of the carriers generated by the avalanche multiplication result in a substrate current. Light emission occurs in the process of recombination of such hot carriers. New electron-hole pairs are generated in the same semiconductor substrate by the emitted light. A part of the generated carriers diffuses through the semiconductor substrate and is mixed in the photosensors. Since the degree of mixture is not constant for all of the photosensors, fixed-pattern noise is generated.

FIG. 2 is a schematic diagram illustrating the manner of generation of fixed-pattern noise in a one-dimensional photoelectric transducer having a conventional CMOS constant-current source, together with a plan view of the semiconductor substrate. In FIG. 2, a constant-current-source circuit having the same configuration as the current mirror circuits shown in FIG. 1 is provided. The upper-stage current mirror circuit includes pMOS transistors, and the lower-stage current mirror circuit includes nMOS transistors. These circuits are disposed in the vicinity of the fourth to the sixth photosensor elements of a photosensor array. It can be understood that a dark output at a portion where the constant-current source is disposed is larger than other bit outputs and results in fixed-pattern noise.

SUMMARY OF THE INVENTION

It is an object of the present invention to provide a photoelectric transducer formed on the same semiconductor substrate which can reduce noise.

It is another object of the present invention to provide a photoelectric transducer having a CMOS constant-current circuit which can reduce fixed-pattern noise when the CMOS constant-current circuit and photosensors are formed on the same semiconductor substrate.

According to one aspect, the present invention which achieves these objectives relates to a photoelectric transducer including a current mirror circuit which includes a first pMOS transistor whose source is connected to a positive power supply, a second pMOS transistor whose source is connected to the positive power supply, and whose gate and drain are connected to the gate of the first pmOS transistor, a first nMOS transistor whose source is connected to a reference potential, and whose gate and drain are connected to the drain of the first pMOS transistor, and a second nMOS transistor whose source is connected to the reference potential via a resistor, and whose gate is connected to the gate of the first nMOS transistor, and whose drain is connected to the drain of the second pMOS transistor, and a plurality of photosensors including a first-conduction-type semiconductor substrate and a plurality of second-conduction-type semiconductor regions formed near a surface of the first-conduction-type semiconductor substrate. The current mirror circuit and the plurality of photosensors are formed on the same semiconductor substrate. Voltage drop means is provided between the drain of the second nMOS transistor and the drain of the second pMOS transistor.

According to another aspect, the present invention which achieves these objectives relates to a photoelectric transducer including a first current mirror circuit which includes pMOS transistors connected to a positive power supply, a second current mirror circuit which includes nMOS transistors connected to a reference potential so as to receive respective currents of the first current mirror circuit, a constant-voltage output circuit for outputting a constant voltage from a connection point of the first current mirror circuit and the second current mirror circuit, a plurality of photosensors including a first-conduction-type semiconductor substrate and a plurality of second-conduction-type second semiconductor regions formed near a surface of the first-conduction-type semiconductor substrate, a source follower circuit for converting photoelectric charges of the photosensors into a voltage and outputting the obtained voltage, and a switching MOS transistor provided between the output of the source follower circuit and the positive power supply. These circuits and components are formed on the same semiconductor substrate. The gate of the switching MOS transistor is connected to the output of the constant-voltage output circuit, and voltage drop means is provided at one of connection points of the first current mirror circuit and the second current mirror circuit.

According to still another aspect, the present invention which achieves these objectives relates to photoelectric transducer including a constant-current-source circuit in which a current mirror circuit including second-conduction-type MOS transistors and a current mirror circuit including first-conduction-type MOS transistors are subjected to tandem connection between power supplies, and a plurality of photosensors formed by a second-conduction-type semiconductor formed near a surface of a first-conduction-type semiconductor substrate. The constant-current-source circuit and the plurality of photosensors are formed on the same semiconductor substrate. Voltage drop means is provided at one of tandem connection portions of the current mirror circuits in order to suppress stray carriers mixed in the plurality of photosensors.

According to yet another aspect, the present invention which achieves these objectives relates to a photoelectric transducer including at least a plurality of transistors including a photosensor unit formed in the same semiconductor chip, and control means for suppressing noise for the photosensor unit due to avalanche multiplication in one of the plurality of transistors.

The foregoing and other objects, advantages and features of the present invention will become more apparent from the following description of the preferred embodiments taken in conjunction with the accompanying drawings.

DESCRIPTION OF THE PREFERRED EMBODIMENTS

The result of an experiment performed by the inventors of the present invention and others indicates that the amount of a substrate current of an nMOS transistor is larger by about 4–5 digits (orders of magnitudes) than that of a pMOS transistor. It can be considered that this result reflects the effect that the ionization rate of electrons is larger than that of holes, although it is also caused by the profile of the well concentration/the drain-diffusion-layer concentration.

As for correlation between the amount of stray carriers and the operating point of a MOS transistor, the amount of stray carriers depends more on the source-drain voltage than on the gate voltage. The amount of stray carriers increases exponentially as the source-drain voltage increases.

Figure 1:
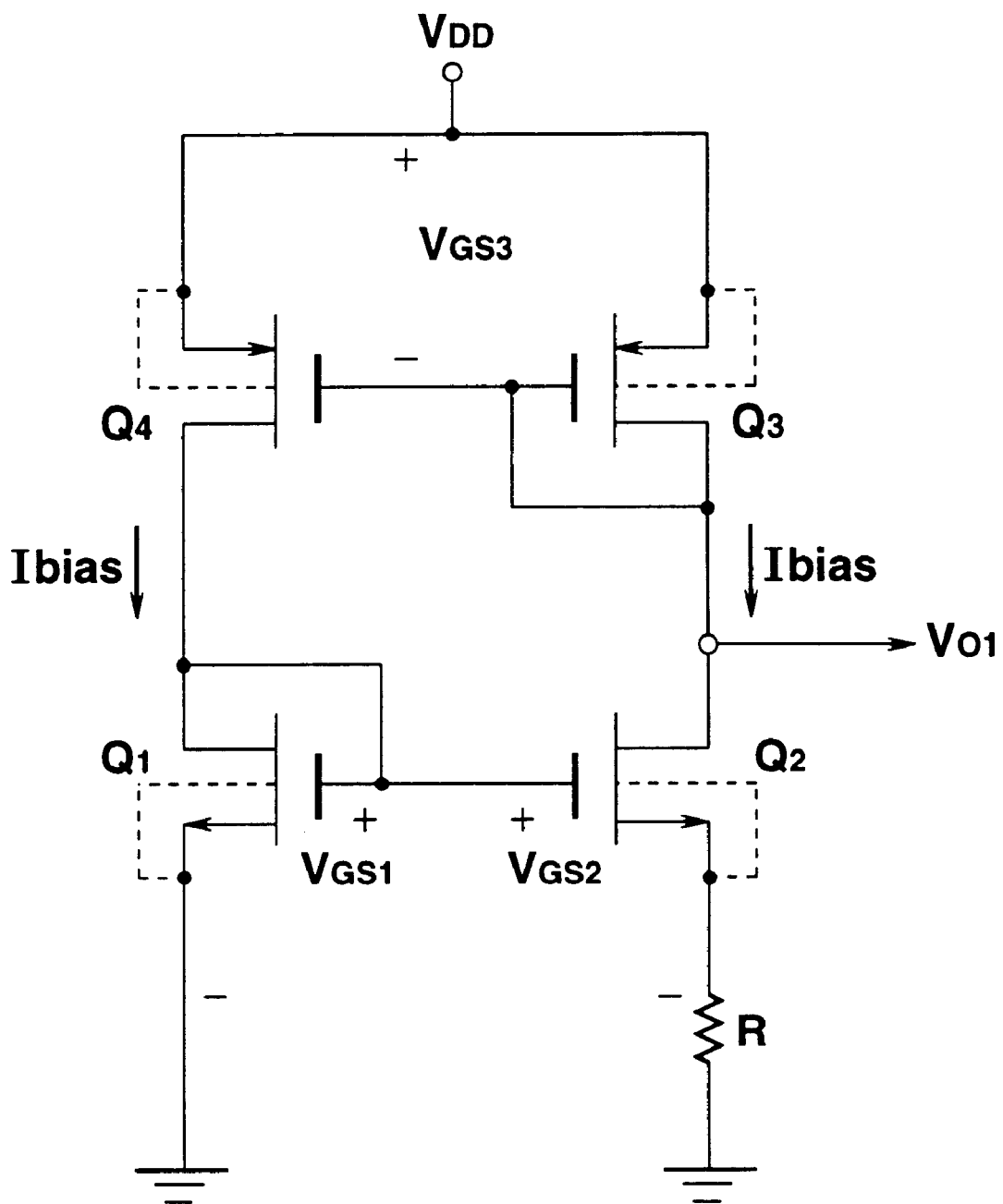
FIG. 1 is a diagram illustrating an equivalent circuit of a conventional CMOS constant-current-source circuit.
Figure 2:
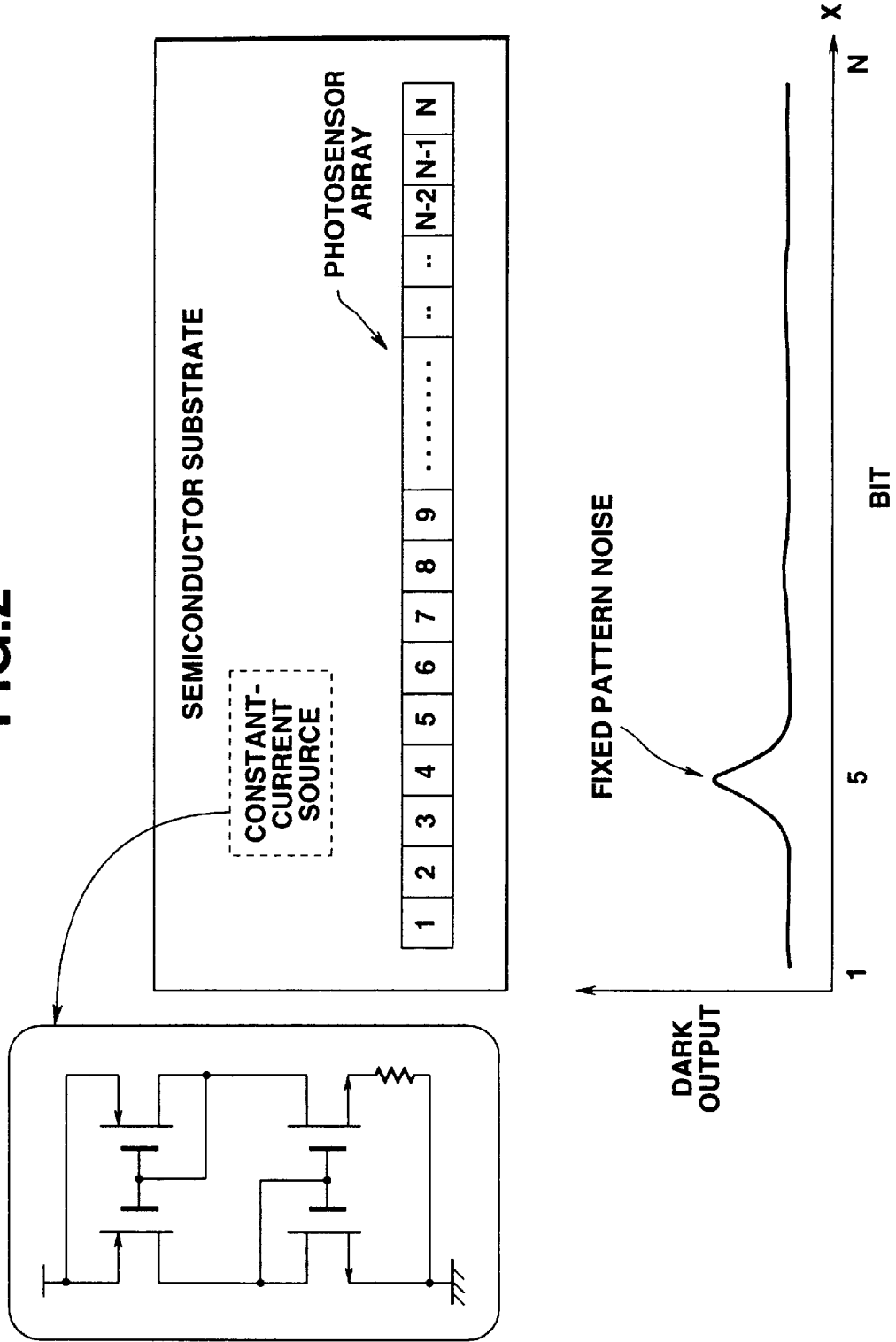
FIG. 2 is a schematic diagram illustrating the generation of fixed-pattern noise in a conventional photoelectric transducer.

From the above-described results, the inventors of the present invention and others obtained the knowledge that an nMOS transistor generates stray carriers and the amount of the stray carriers increases as the source-drain voltage increases, and also found that in the conventional CMOS constant-current source, the nMOS transistor Q2 shown in FIG. 1 generates stray carriers, and that by reducing the source-drain voltage of this nMOS transistor using voltage drop means, fixed-pattern noise due to stray carriers can be reduced.

By using means other than an nMOS transistor, such as a resistor, a diode, a pMOS diode, a bipolar transistor or the like, as the voltage drop means, stray carriers can be more effectively reduced.

The amount of voltage drop by the voltage drop means may be adopted so as to secure the source-drain voltage to make the operating point of the nMOS transistor in a saturation region. By setting the amount of the voltage drop to a value close to the source-drain voltage of the nMOS transistor whose gate is connected to the gate of another nMOS transistor to form a current mirror circuit (the nMOS transistor Q1 shown in FIG. 1), it is possible to prevent degradation in mirror accuracy due to a change in the current in the saturation region of the MOS transistor, and to realize a current mirror circuit and a constant-current source having high accuracy. In the case of supplying a current generated in a CMOS constant-current-source circuit, which uses current mirror circuits including CMOS transistors, as a desired bias current, also, the same effects can be obtained by providing voltage drop means between the drain of an nMOS transistor and the drain of a pMOS transistor.

Stray carriers are minority carriers diffusing in the semiconductor substrate. Considering the fact that the diffusion length of holes in an n-type semiconductor substrate is shorter, it is more advantageous to use an n-type semiconductor substrate for reducing fixed-pattern noise.

A substrate having an n-type epitaxial layer formed on an n-type silicon wafer, a substrate having a high-concentration n-type buried layer provided in an n-type silicon wafer and an n-type epitaxial layer, and the like may be used in addition to an ordinary n-type silicon wafer as the n-type semiconductor substrate in the present invention.

The amount of current caused by stray carriers is very small. Hence, the effect of reducing fixed-pattern noise is larger when the configuration of the present invention is applied to a charged-storing photoelectric transducer than when the configuration of the present invention is applied to a current-reading photoelectric transducer.

Of course, the present invention is effective in reducing fixed-pattern noise not only in a one-dimensional photoelectric transducer but also in a two-dimensional photoelectric transducer. The above-described functions have been described as an example of application of the present invention.

Next, the configurations of photoelectric transducers, each having a current-mirror-type CMOS constant-current circuit, according to preferred embodiments of the present invention will be described.

First Embodiment

Figure 3:
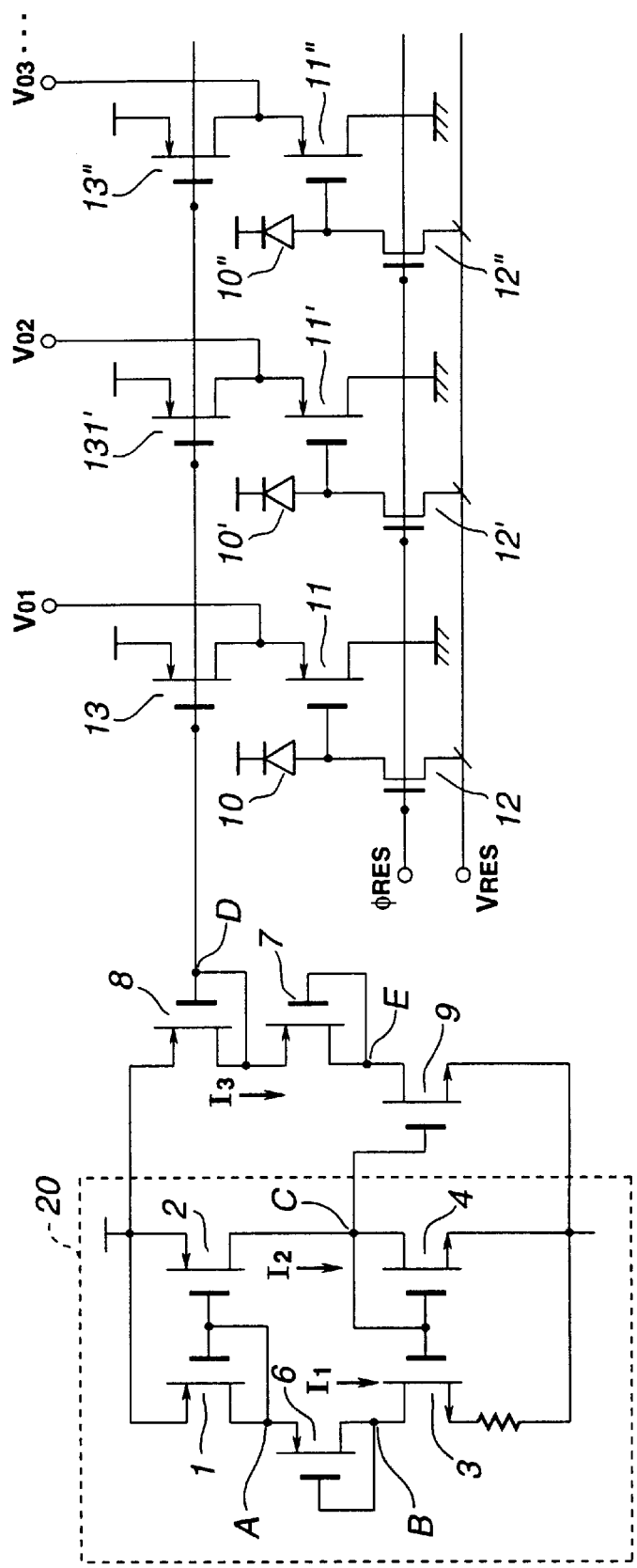
FIG. 3 is diagram illustrating an equivalent circuit for three pixels in a first embodiment of the present invention.
Figure 4:
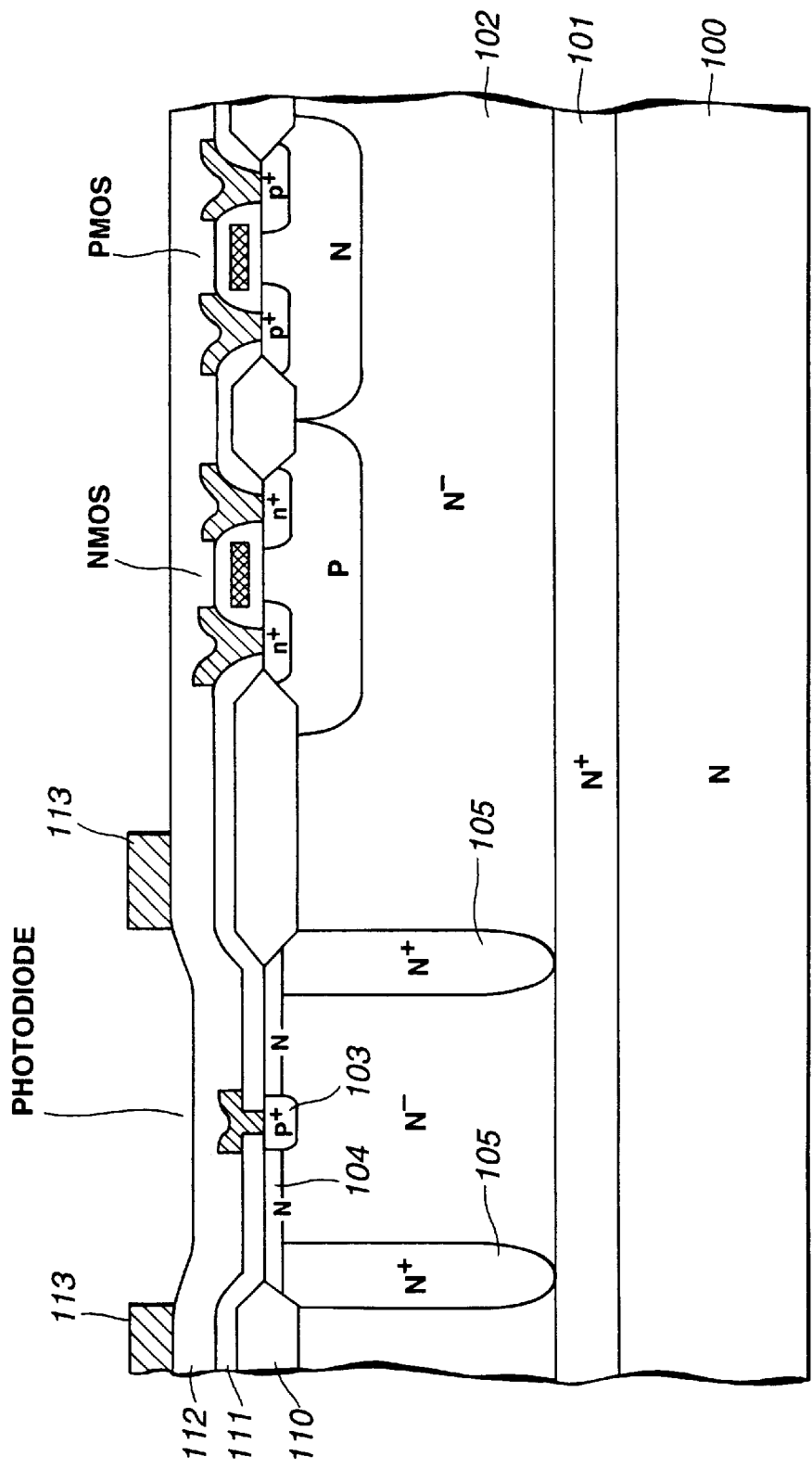
FIG. 4 is a cross-sectional view illustrating the configuration of a photosensor element and a CMOS transistor in the first embodiment.

FIG. 3 is a diagram illustrating an equivalent circuit for three pixels in a first embodiment of the present invention. FIG. 4 is a cross-sectional view of a photosensor element and a CMOS transistor in the first embodiment.

In a photoelectric transducer according to the first embodiment, the gates of pMOS transistors 11, 11' and 11", and the drains of reset switches 12, 12' and 12" are connected to the anodes of photodiodes 10, 10' and 10", and signal charges generated in the photodiodes 10, 10' and 10" are read from output terminals $V_{O1}$, $V_{O2}$ and $V_{O3}$ of pMOS source followers, respectively. The pMOS transistors 11, 11' and 11" operating as the source followers use pMOS transistors 13, 13' and 13" as constant-current loads, respectively. Although the constant-current source having the constant-current loads has a circuit configuration similar to the circuit configuration in the above-described prior art, a pMOS transistor 6 whose gate and drain are directly connected to each other is provided between the gate and the drain of a pMOS transistor 1 and the drain of an nMOS transistor 3. The current generated by the constant-current source is used as a constant-current load for a source follower including an nMOS transistor 9 by a current mirror circuit including a PMOS transistor 8 and the pMOS transistors 13, 13' and 13". In this current mirror portion, also, the source-drain voltage of the nMOS transistor 9 is reduced using a pMOS transistor 7.

In the cross-sectional view of the photosensor element and the CMOS transistor shown in FIG. 4, an n-type buried layer 101 and an n-type epitaxial layer 102 are formed on an n-type semiconductor substrate 100. The impurity concentrations in the n-type semiconductor substrate 100, the n-type buried layer 101 and the epitaxial layer 102 are about $10^{16}$ cm$^{-3}$, about $10^{18}$ cm$^{-3}$ at most, and about $10^{15}$ cm$^{-3}$, respectively.

A p-type region 103 and an n-type region 104 are formed in a surface portion of the epitaxial layer at a photodiode portion, and an n-type barrier region 105 is formed around the photosensor element. According to the pixel structure of the first embodiment, even if holes serving as stray carriers are generated in the n-type substrate, mixture of holes into a pixel made by the photosensor element comprising a photodiode can be reduced by the potential barrier provided by the n-type barrier region 105.

Although FIG. 3 illustrates an equivalent circuit for only three pixels, the first embodiment actually relates to a one-dimensional photoelectric transducer having, for example, 234 pixels.

The following Table 1 shows the result of comparison between the first embodiment and the prior art which does not have the pMOS transistors 6 and 7 with respect to fixed-pattern noise, currents $I_1$ and $I_2$ in the constant-current source, a current $I_3$ in the current mirror portion which serves as an output load for each photosensor element, and voltages at respective nodes A–E.

TABLE 1

|  | First embodiment | Prior Art |
|---|---|---|
| Fixed-pattern noise | about 5 mV | about 26 mV |
| $I_1$ |  | about 20 µA |
| $I_2$ |  | about 20 µA |
| $I_3$ |  | about 60 µA |

TABLE 1-continued

|  | First embodiment | Prior Art |
|---|---|---|
| Voltage at point A | about 3.8 V |  |
|  |  | about 3.8 V |
| Voltage at point B | about 1.3 V |  |
| Voltage at point C | about 1.2 V | about 1.2 V |
| Voltage at point D | about 3.4 V |  |
|  |  | about 3.4 V |
| Voltage at point E | about 1.3 V |  |

As described aboe, according to the first embodiment, by using voltage drop means for reducing the source-drain voltage of an nMOS transistor causing stray carriers, fixed-pattern noise due to the stray carriers is greatly reduced.

Second Embodiment

Figure 5:
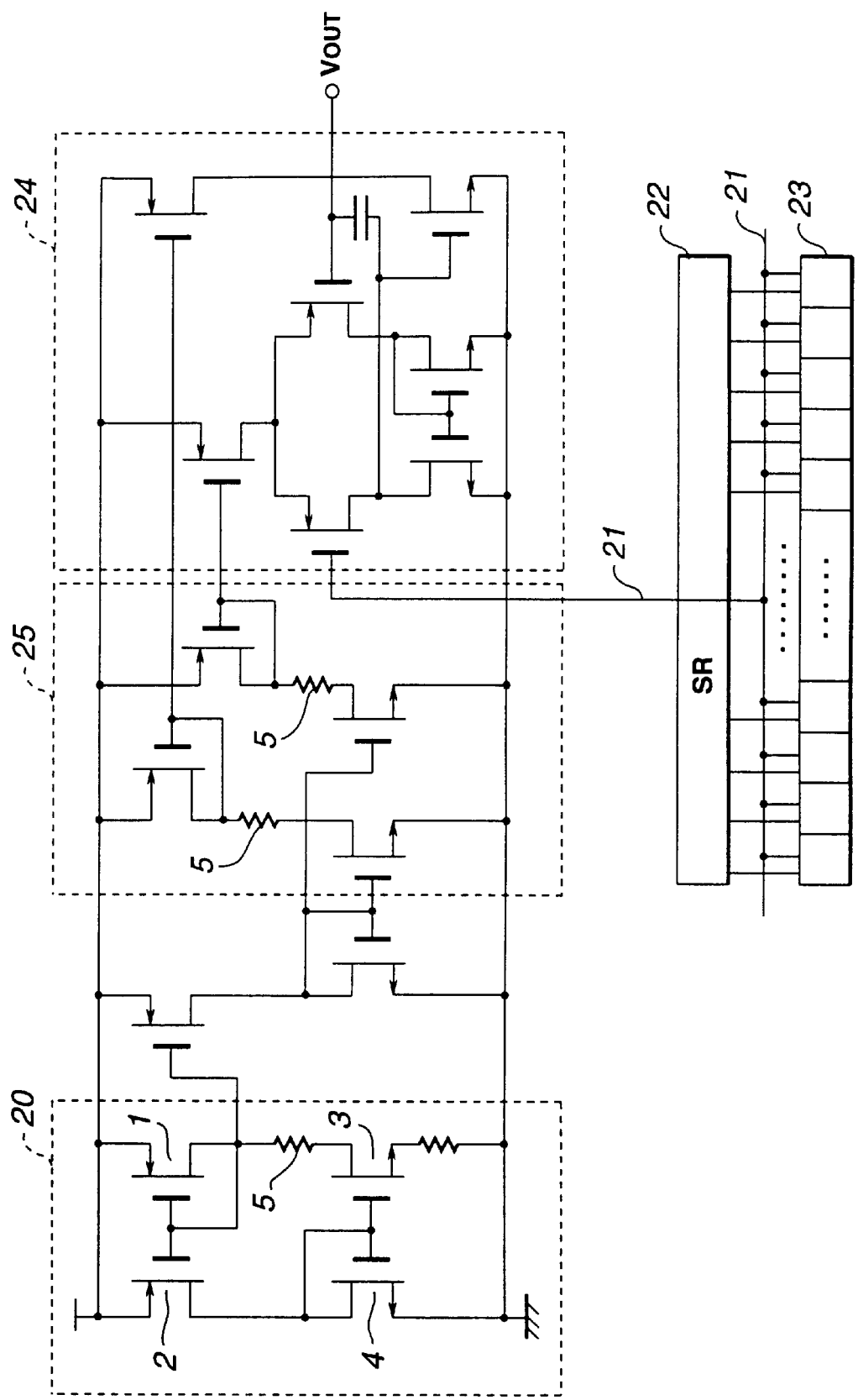
FIG. 5 is a diagram illustrating an equivalent circuit in a s second embodiment of the present invention.

FIG. 5 is a diagram illustrating an equivalent circuit in a second embodiment of the present invention. The second embodiment relates to a photoelectric transducer for outputtin a signal by performing impedance conversion of a common output line 21 of a photosensor array 23 using an operational amplifier 24. A shift register 22 provides a timing for sequentially reading signals from respective photosensor elements of the photosensor array 23. The photosensor array 23, the shift register 22, a constant-current source 20 and output terminals thereof, and the operational amplifier 24 are formed in the same semiconductor substrate. Each photosensor element of the photosensor array 23 may have the configuration of the photodiode and the source follower shown in FIG. 3, or any other appropriate configuration. The operational amplifier 24 may have the configuration shown in FIG. 3, or any other appropriate configuration.

In the second embodiment, resistors 5 are used as voltage drop means for the source-drain voltage of nMOS transistors of the constant-current source 20 and a current mirror circuit 25.

The current generated by the constant-current source 20 is supplied to the operational amplifier 24 using the current mirror circuit 25.

A signal output as a result of photoelectric conversion in the photosensor array 23 is sequentially supplied to the common output line 21 by the shift register 22. The common output line 21 is connected to an input terminal of the operational amplifier 24.

The photosensor array 23, the constant-current-source circuit 20, the current mirror circuit 25 and the operational amplifier 24 are formed in the same n-type semiconductor substrate.

The fixed-pattern noise in the photoelectric transducer of the second embodiment is about 7 mV, in contrast to about 34 mV in the prior art which does not have the resistor 5. Hence, the effectiveness of the present invention is confirmed.

In the second embodiment, the case of using a one-dimensional photosensor array has been illustrated. When using a two-dimensional configuration, by performing scanning of a matrix configuration in the horizontal direction and in the vertical direction, a signal can be sequentially read for each line and an image signal can be time serially read from an operational amplifier. In such a case, by using the constant-current source shown in FIG. 3 or 5 for driving the operational amplifier, fixed-pattern noise due to mixture of stray carriers in a photosensor array disposed near the constant-current source can be greatly suppressed.

A read image signal in which fixed-pattern noise in the photosensor array shown above is suppressed is processed by a sample-and-hold circuit, a shading circuit for removing variations in the sensitivity of respective photosensor elements, a gamma circuit and the like, and a high-quality image signal is output. An image read by such a photoelectric transducer is effectively used and processed by a copier, a facsimile apparatus, an image scanner or the like.

As described above, in the foregoing embodiments, by providing voltage drop means for reducing the source-drain voltage of an nMOS transistor in the CMOS constant-current source or the current mirror circuit, fixed-pattern noise due to stray carriers generated in the semiconductor substrate can be greatly reduced. Hence, the present invention is very effective.

Although control means in the present invention relates to the voltage drop means in the CMOS constant-current source in each of the above-described embodiments, the control means is not limited to the voltage drop means. That is, the control means includes any device having the function of reducing noise in a transistor generating noise for a photosensor array due to avalanche multiplication in the photoelectric transducer including the photosensor array provided in the same substrate.

The individual components shown in outline in the drawings are all well-known in the photoelectric transducer arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A photoelectric conversion device on a single semiconductor substrate comprising:

a plurality of photosensing portions;

a processing circuit that processes signals from said plurality of photosensing portions, wherein said processing circuit includes a transistor;

a voltage drop device that reduces the voltage between main electrodes of said transistor, wherein said voltage between main electrodes of said transistor is reduced by voltage drop of said voltage drop device;

a common output portion that outputs signals from said plurality of photosensing portions; and a select circuit that selects signals from said plurality of photosensing portions to said common output portion, wherein said processing circuit processes signals from said common output portion, and wherein said processing circuit includes an amplifier and a power source circuit supplying said amplifier with power, wherein said power source circuit controls the current being passed through said amplifier, and wherein said transistor is included in said power source circuit, and wherein said voltage drop device is connected in series with said transistor.

2. A device according to claim 1, wherein said power source circuit includes a constant current source circuit, and said transistor is included in said constant current source circuit.

3. A device according to claim 1, wherein said voltage drop device includes any one of a resistor, a transistor, and a diode.

4. An image processing apparatus comprising:

a photoelectric conversion device according to claim 1; and a processing device for processing signals from said photoelectric conversion device.

5. An image processing apparatus according to claim 4, wherein said processing device performs shading correction and/or gamma correction.

6. A photoelectric conversion device on a single semiconductor substrate comprising:

a plurality of pixels, each pixel including a photosensing portion and a reset transistor that performs reset operation;

a power source circuit including a transistor; and a voltage drop device that reduces the voltage between the main electrodes of said transistor, wherein said voltage between the main electrodes of said transistor is reduced by the voltage drop of said voltage drop device, wherein said voltage drop device is connected in series with said transistor and wherein each said pixel includes an amplifying transistor that amplifies and outputs a signal from said photosensing portion, wherein said power supply circuit controls the current being passed through said amplifying transistor.

7. A device according to claim 6, wherein said voltage drop device includes any one of a resistor, a transistor, and a diode.

8. A device according to claim 6, wherein said power source circuit includes a constant current source circuit, wherein said transistor is included in said constant current source circuit.

9. A device according to claim 6, further comprising:

a load transistor, wherein said pixel includes an amplify transistor that amplifies and outputs a signal from said photosensing portion, and said load transistor and said amplify transistor form a source follower, and said power source circuit supplied said load transistor with bias.

10. An image processing device comprising:

a photoelectric conversion device according to claim 6; and a processing device for processing the signals from said photoelectric conversion device.

11. An image processing device according to claim 10, wherein said processing device performs shading correction and/or gamma correction.

* * * * *

UNITED STATES PATENT AND TRADEMARK OFFICE
CERTIFICATE OF CORRECTION

PATENT NO. : 6,437,309 B1 Page 1 of 1
DATED : August 20, 2002
INVENTOR(S) : Hiraku Kozuka et al.

It is certified that error appears in the above-identified patent and that said Letters Patent is hereby corrected as shown below:

Column 1,
Line 36, "4.5.) is" should read -- 4.5) is --.

Column 2,
Line 48, "pmOS" should read -- pMOS --.

Column 3,
Line 62, "s second" should read -- second --.

Column 6,
Line 12, "aboe" should read -- above --; and
Line 20, "tin" should read -- ting --.

Column 8,
Line 34, "supply" should read -- source --; and
Line 49, "supplied" should read -- supplies --.

Signed and Sealed this

Fourth Day of March, 2003

Attest:

JAMES E. ROGAN
Attesting Officer   Director of the United States Patent and Trademark Office